United States Patent
Higuchi

(10) Patent No.: US 9,520,381 B2
(45) Date of Patent: Dec. 13, 2016

(54) SEMICONDUCTOR DEVICE FOR USE IN FLIP-CHIP BONDING, WHICH REDUCES LATERAL DISPLACEMENT

(71) Applicant: Panasonic Intellectual Property Management Co., Ltd., Osaka (JP)

(72) Inventor: Yuichi Higuchi, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 14/592,576

(22) Filed: Jan. 8, 2015

(65) Prior Publication Data
US 2015/0115440 A1    Apr. 30, 2015

Related U.S. Application Data

(63) Continuation of application No. PCT/JP2013/001915, filed on Mar. 21, 2013.

(30) Foreign Application Priority Data

Aug. 29, 2012 (JP) ................. 2012-189231

(51) Int. Cl.
*H01L 25/065* (2006.01)
*H01L 23/00* (2006.01)
(Continued)

(52) U.S. Cl.
CPC ......... *H01L 25/0657* (2013.01); *H01L 23/481* (2013.01); *H01L 24/05* (2013.01);
(Continued)

(58) Field of Classification Search
CPC .................... H01L 25/0657; H01L 24/17
See application file for complete search history.

(56) References Cited

U.S. PATENT DOCUMENTS 5,872,399 A * 2/1999 Lee .................. H01L 23/49816
257/668
6,179,198 B1 * 1/2001 Eifuku et al. ............. 228/180.22
(Continued)

FOREIGN PATENT DOCUMENTS

JP    07-050316 A    2/1995
JP    10-303330 A    11/1998
(Continued)

OTHER PUBLICATIONS

International Search Report issued in International Application No. PCT/JP2013/001915 dated Jun. 4, 2013, with English translation.

*Primary Examiner* — William Coleman
(74) *Attorney, Agent, or Firm* — McDermott Will & Emery LLP

(57) ABSTRACT

A semiconductor device includes multilayer chips in which a first semiconductor chip and a second semiconductor chip are bonded together. A first electrode pad is formed on a principal surface of the first semiconductor chip, and a first bump is formed on the first electrode pad. A second bump is formed on the principal surface of the second semiconductor chip such that the second bump is bonded to the first bump. The first electrode pad has an opening, and the opening and an entire peripheral portion of the opening form a stepped shape form a stepped shape. The first bump has a recessed shape that is recessed at a center thereof and covers the stepped shape.

16 Claims, 7 Drawing Sheets

(51) Int. Cl.
*H01L 23/48* (2006.01)
*H01L 21/56* (2006.01)

(52) U.S. Cl.
CPC .............. *H01L 24/13* (2013.01); *H01L 24/16* (2013.01); *H01L 24/17* (2013.01); *H01L 24/81* (2013.01); *H01L 21/563* (2013.01); *H01L 24/02* (2013.01); *H01L 24/03* (2013.01); *H01L 24/11* (2013.01); *H01L 24/32* (2013.01); *H01L 24/83* (2013.01); *H01L 2224/0239* (2013.01); *H01L 2224/02372* (2013.01); *H01L 2224/0345* (2013.01); *H01L 2224/03462* (2013.01); *H01L 2224/03614* (2013.01); *H01L 2224/03912* (2013.01); *H01L 2224/03914* (2013.01); *H01L 2224/0401* (2013.01); *H01L 2224/05011* (2013.01); *H01L 2224/05012* (2013.01); *H01L 2224/05015* (2013.01); *H01L 2224/05073* (2013.01); *H01L 2224/05082* (2013.01); *H01L 2224/05124* (2013.01); *H01L 2224/05166* (2013.01); *H01L 2224/05187* (2013.01); *H01L 2224/05551* (2013.01); *H01L 2224/05552* (2013.01); *H01L 2224/05555* (2013.01); *H01L 2224/05557* (2013.01); *H01L 2224/05558* (2013.01); *H01L 2224/05559* (2013.01); *H01L 2224/05573* (2013.01); *H01L 2224/05582* (2013.01); *H01L 2224/05609* (2013.01); *H01L 2224/05611* (2013.01); *H01L 2224/05613* (2013.01); *H01L 2224/05617* (2013.01); *H01L 2224/05618* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05657* (2013.01); *H01L 2224/05666* (2013.01); *H01L 2224/05684* (2013.01); *H01L 2224/1145* (2013.01); *H01L 2224/11462* (2013.01); *H01L 2224/131* (2013.01); *H01L 2224/13014* (2013.01); *H01L 2224/13017* (2013.01); *H01L 2224/13019* (2013.01); *H01L 2224/13024* (2013.01); *H01L 2224/13025* (2013.01); *H01L 2224/13082* (2013.01); *H01L 2224/13083* (2013.01); *H01L 2224/13109* (2013.01); *H01L 2224/13111* (2013.01); *H01L 2224/13113* (2013.01); *H01L 2224/13117* (2013.01); *H01L 2224/13118* (2013.01); *H01L 2224/13139* (2013.01); *H01L 2224/13144* (2013.01); *H01L 2224/13147* (2013.01); *H01L 2224/13155* (2013.01); *H01L 2224/13157* (2013.01); *H01L 2224/13166* (2013.01); *H01L 2224/13184* (2013.01); *H01L 2224/16014* (2013.01); *H01L 2224/16058* (2013.01); *H01L 2224/16148* (2013.01); *H01L 2224/16237* (2013.01); *H01L 2224/32145* (2013.01); *H01L 2224/73104* (2013.01); *H01L 2224/73204* (2013.01); *H01L 2224/8112* (2013.01); *H01L 2224/81121* (2013.01); *H01L 2224/81141* (2013.01); *H01L 2224/81143* (2013.01); *H01L 2224/81193* (2013.01); *H01L 2224/81201* (2013.01); *H01L 2224/83862* (2013.01); *H01L 2224/92125* (2013.01); *H01L 2225/06513* (2013.01); *H01L 2225/06541* (2013.01); *H01L 2225/06548* (2013.01); *H01L 2225/06593* (2013.01); *H01L 2924/01032* (2013.01); *H01L 2924/207* (2013.01); *H01L 2924/2075* (2013.01); *H01L 2924/20751* (2013.01); *H01L 2924/20752* (2013.01); *H01L 2924/20753* (2013.01); *H01L 2924/20754* (2013.01); *H01L 2924/20755* (2013.01); *H01L 2924/381* (2013.01); *H01L 2924/384* (2013.01)

(56) References Cited

U.S. PATENT DOCUMENTS

| | | | |
|---|---|---|---|
| 6,426,556 B1 * | 7/2002 | Lin | H01L 24/03 257/738 |
| 6,646,286 B1 * | 11/2003 | Akram | 257/48 |
| 7,015,590 B2 * | 3/2006 | Jeong et al. | 257/780 |
| 7,118,389 B2 * | 10/2006 | Fork | G01R 1/0466 439/74 |
| 7,427,557 B2 * | 9/2008 | Rinne et al. | 438/612 |
| 7,557,452 B1 * | 7/2009 | Williams et al. | 257/778 |
| 8,093,728 B2 * | 1/2012 | Marion | 257/779 |
| 8,237,273 B2 * | 8/2012 | Hsu | H01L 23/498 257/737 |
| 8,241,963 B2 * | 8/2012 | Shen | H01L 23/49816 257/737 |
| 8,779,588 B2 * | 7/2014 | Yu | H01L 24/13 257/734 |
| 8,928,141 B2 * | 1/2015 | Souriau | 257/737 |
| 2009/0255705 A1 | 10/2009 | Pratt | |
| 2012/0086119 A1 | 4/2012 | Wu | |
| 2013/0256878 A1 * | 10/2013 | Hsu et al. | 257/737 |

FOREIGN PATENT DOCUMENTS

| | | |
|---|---|---|
| JP | 2001-332584 A | 11/2001 |
| JP | 2005-079379 A | 3/2005 |
| JP | 2008-021751 A | 1/2008 |
| JP | 2011-517114 A | 5/2011 |

* cited by examiner

SEMICONDUCTOR DEVICE FOR USE IN FLIP-CHIP BONDING, WHICH REDUCES LATERAL DISPLACEMENT

CROSS-REFERENCE TO RELATED APPLICATIONS

This is a continuation of International Application No. PCT/JP2013/001915 filed on Mar. 21, 2013, which claims priority to Japanese Patent Application No. 2012-189231 filed on Aug. 29, 2012. The entire disclosures of these applications are incorporated by reference herein.

BACKGROUND

The present disclosure relates to semiconductor devices, particularly to a semiconductor device with a structure in which a plurality of semiconductor chips are directly bonded together by bumps.

LSI technology, which is a key technology for multimedia equipment, has been steadily developed in recent years in order to achieve higher-speed data transmission and larger capacity. With this development, a packaging technique for an interface between LSI and electronic equipment has also been developed to achieve higher densities.

A known high-density package is a system-in package (SIP) in which multiple LSI devices are integrated in a single package for a system. Some SIPs employ a package in which multiple semiconductor chips are mounted on a common circuit board (an interposer). Another known package has a chip-on-chip (CoC) structure of a stacked chip type in which multiple semiconductor chips are stacked by using, as a circuit board, not an interposer but another semiconductor chip.

To achieve multiple pins in the SIP described above, flip-chip bonding has been put into practical use in recent years. In the flip-chip bonding, minute bumps (metal projections) are formed on electrode pads on a surface of a semiconductor chip and a surface of a circuit board (or a semiconductor chip), and these surfaces are bonded together and are electrically coupled to each other (face-to-face joint).

In addition, the technique of using a through-silicon via (TSV) is employed as one of packaging techniques for higher densities. The use of the TSV enables electrodes to be also formed on a back surface of a wafer. In view of this, it is also proposed that minute bumps in the shape of electrode pads are formed on the back surface of a semiconductor chip having a TSV and the front surface of another semiconductor chip, and these chips are electrically bonded together (face-to-back bonding).

In such a bonding technique, a semiconductor chip provided with a plurality of bumps are mounted by using a bonder on a circuit board also provided with a plurality of bumps.

In this case, a semiconductor chip and either a circuit board or a semiconductor chip are accurately positioned relative to each other with, for example, image recognition by using a bonder, and then, bumps on the semiconductor chip and bumps on the circuit board are oriented face to face and a pressure is applied to the bumps.

Accordingly, unless the positioning of the semiconductor chip and the circuit board, for example, is not accurately performed, when the bumps are actually oriented face to face and a pressure is applied to the bumps, a displacement between the bumps causes the bumps to slide, and the semiconductor chip to slide accordingly. This sliding of the semiconductor chip causes joint defects (e.g., an increase in resistance, an open defect, and a short-circuit defect in a bump joint). As the pitch of the bumps increases, these defects become more conspicuous because the margin for the displacement among the bumps decreases.

In view of this, in a typical technique for bonding, a projecting stud bump for alignment is formed on a semiconductor chip and a recessed guide hole for alignment is formed in a circuit board on which the chip is to be mounted such that position adjustment is performed by inserting the tip of the stud bump into the guide hole (see, for example, Japanese Unexamined Patent Publication No. H07-50316).

Similarly, in another proposed technique for bonding, a first projecting alignment feature is formed on a first semiconductor chip and a recessed second alignment feature is formed on a second semiconductor chip, and a tip of the first projecting alignment feature is inserted in the second alignment feature so that position adjustment is performed (see, for example, Japanese Unexamined Patent Publication No. 2011-517114).

SUMMARY

The techniques of Japanese Unexamined Patent Publication No. H07-50316 and Japanese Unexamined Patent Publication No. 2011-517114, however, require formation of the structure for alignment on each of the chip and the circuit board in addition to the step of forming bumps on the chip and the circuit board. This disadvantageously complicates fabrication processes.

It is therefore an object of the present disclosure to provide, without an increase in the number of fabrication processes, a semiconductor device in which even when an overlapping displacement occurs between a first chip and a second chip in bonding, sliding of bumps to be electrically connected to each other and a lateral displacement caused by the sliding can be reduced, and thereby, the semiconductor chips are accurately positioned relative to each other.

To achieve the object, a semiconductor device according to the present disclosure includes a multilayer chip including a first semiconductor chip and a second semiconductor chip that are bonded together, wherein a first electrode pad is provided on a principal surface of the first semiconductor chip, a first bump is provided on the first electrode pad, a second bump is provided on a principal surface of the second semiconductor chip and is bonded to the first bump, the first electrode pad has an opening, the opening and an entire peripheral portion form a stepped shape, and the first bump has a recessed shape that is recessed at a center thereof and covers the stepped shape.

In the semiconductor device, the first electrode pad may have a hollow cylindrical shape in plan view.

In the semiconductor device, the second bump may have a diameter equal to or smaller than an inner diameter of the hollow cylindrical shape of the first electrode pad.

The semiconductor device may further include a first passivation layer that covers the first semiconductor chip, is sandwiched between the first bump and the first electrode pad, and has an opening in which the first electrode pad is exposed such that an end of the opening is located on the first electrode pad, wherein the opening of the first passivation layer has a diameter smaller than a diameter of the first bump and larger than an inner diameter of the hollow cylindrical shape of the first electrode pad.

In the semiconductor device, the first electrode pad may have a slit in the peripheral portion.

In the semiconductor device, a through-hole electrode may penetrate at least one of the first semiconductor chip or the second semiconductor chip from a front surface to a back surface thereof, and the through-hole electrode may be electrically connected to the first bump and the second bump.

In the semiconductor device, the first bump may be made of either a metal selected from the group consisting of copper, tin, nickel, silver, gold, cobalt, bismuth, zinc, indium, germanium, and tungsten, or a conductive metal compound containing a metal selected from the group consisting of copper, tin, nickel, silver, gold, cobalt, bismuth, zinc, indium, germanium, and tungsten.

In the semiconductor device, the second bump may be made of either a metal selected from the group consisting of copper, tin, nickel, silver, gold, cobalt, bismuth, zinc, indium, germanium, and tungsten, or a conductive metal compound containing a metal selected from the group consisting of copper, tin, nickel, silver, gold, cobalt, bismuth, zinc, indium, germanium, and tungsten.

In the semiconductor device, the first bump may have a diameter of 4 μm to 30 μm.

In the semiconductor device, the second bump may have a diameter of 2 μm to 25 μm.

In the semiconductor device, the first electrode pad may have an inner diameter of 2 μm to 25 μm.

In the semiconductor device, the first electrode pad may have a thickness of 0.3 μm to 5 μm.

In the semiconductor device, the first bump may have a height of 4 μm to 60 μm.

In the semiconductor device, the second bump has a height of 2 μm to 50 μm.

In the semiconductor device according to the present disclosure, even when an overlapping displacement occurs between the first chip and the second chip in bonding, the second bump is engaged with the recess of the first bump in a self-alignment manner. Thus, sliding between the bumps to be electrically connected and lateral displacement of the semiconductor chips caused by the sliding can be reduced. In addition, the step of patterning the electrode pad into a hollow cylindrical shape can be shared by a patterning process for forming an electrode pad. Thus, no additional mask formation is needed, and thus, the number of fabrication processes does not increase. As a result, the semiconductor chips can be accurately positioned relative to each other without an increase in the number of fabrication processes.

DETAILED DESCRIPTION

An embodiment of the present disclosure will be described with reference to the drawings.

A semiconductor device according to the embodiment will be described with reference to FIG. 1.

The semiconductor device of this embodiment has a multilayer chip configuration in which two semiconductor chips 100 and 200 are stacked, and employs a flip-chip bonding technique that electrically connects the chips by bonding bumps on the interconnect layers of the chips. In this embodiment, the bump pitch is 40 μm, as an example.

Figure 1A:
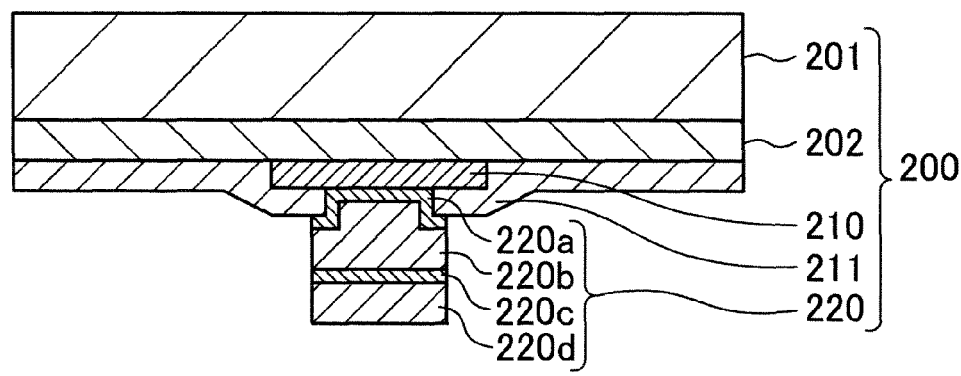
FIG. 1A is a cross-sectional view of orientation in bonding semiconductor chips in a semiconductor device according to an embodiment of the present disclosure.
Figure 1A:
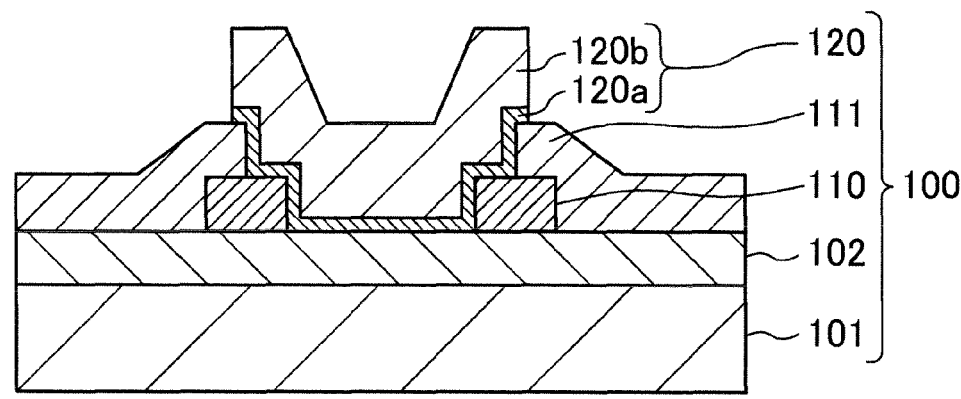

As illustrated in FIG. 1A, a first electrode pad 110 and a first bump 120 are formed on the first semiconductor chip 100 of this embodiment. On the other hand, a second bump 220 is formed on the second semiconductor chip 200. The first semiconductor chip 100 and the second semiconductor chip 200 are, for example, LSI chips.

(First Semiconductor Chip)

As illustrated in FIG. 1A, in the first semiconductor chip 100, a first interconnect layer 102 is stacked on a silicon first semiconductor substrate 101 serving as a base, and a first passivation layer 111 is stacked on the first interconnect layer 102 and covers the first interconnect layer 102. A first electrode pad 110 is formed at a predetermined location on the first interconnect layer 102. A first bump 120 is formed on the first electrode pad 110.

The passivation layer 111 is made of silicon nitride, has a thickness of about 1 μm, and has an opening in which the first electrode pad 110 is formed.

The first electrode pad 110 is made of aluminium (Al) and has a thickness of 2 μm. A center portion of the first electrode pad 110 is cut out into a circle with a diameter of 20 μm. Although not shown, a contact layer of, for example, tantalum nitride with a thickness of about 200 nm may be formed at the interface between the first electrode pad 110 and its underlying first interconnect layer 102. The thickness of the first electrode pad 110 is not Limited to this example, and may be in the range from 0.3 μm to 5 μm, for example. The inner diameter of the first electrode pad 110 is not limited to the value in this example, and may be in the range from 2 μm to 25 μm, for example.

The first bump 120 covers the step of the electrode pad, and has a recessed cross section in which the center portion is recessed in conformity with the shape of the first electrode pad 110. The first bump 120 includes, for example, a first bump contact layer 120a serving as a lower layer, having a thickness of about 200 nm, and made of titanium and a first bump conductive layer 120b serving as an upper layer, having a diameter of 25 μm and a height of 5 μm, and made of copper (Cu). The thickness (height) of the first bump 120 is not limited to this example, and may be in the range from 4 μm to 60 μm, for example. The diameter of the first bump 120 is not limited to this example, and may be in the range from 4 μm to 30 μm, for example.

The material for the first bump conductive layer 120b is not limited to this example, and may be made of a metal containing at least one of copper (Cu), tin (Sn), nickel (Ni), silver (Ag), gold (Au), cobalt (Co), bismuth (B), zinc (Zn), indium (In), germanium (Ge), or tungsten (W) or a conductive metal compound containing at least one of copper (Cu), tin (Sn), nickel (Ni), silver (Ag), gold (Au), cobalt (Co), bismuth (B), zinc (Zn), indium (In), germanium (Ge), or tungsten (W). The first bump contact layer 120a is not necessary as long as the first bump conductive layer 120b can be sufficiently in close contact with its underlying material.

Figure 1B:
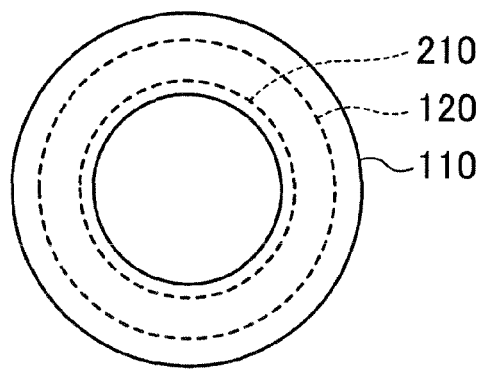
FIG. 1B is a virtual plan view illustrating a positional relationship of bumps.

As illustrated in FIG. 1B, the diameter of the first bump 120 is larger than the diameter of an inner circle formed by cutting out the first electrode pad 110 so as to obtain the recessed shape in which the center is recessed in conformity with the shape of the underlying first electrode pad 110.

The first bump 120 may be formed to cover the step of the first passivation layer 111. Specifically, the diameter of the opening of the passivation layer 111 is larger than the diameter of the inner circle of the cutout shape of the first electrode pad 110 and is smaller than the diameter of the first bump 120. As a result, the recessed shape of the first bump 120 can be formed by using the step of the passivation layer 111 as well as the step of the first electrode pad 110. For example, in the above-described configuration of this embodiment, the diameter of the opening of the passivation layer 111 is 22.5 μm.

The additional use of the step of the passivation layer 111 can increase the area of the recess in the center portion of the first bump 120 in plan view. As a result, in a subsequent step of bonding the first bump 120 to the second bump 220 under pressure, a process margin for an overlapping displacement between the first semiconductor chip 100 and the second semiconductor chip 200 can be further enlarged.

(Second Semiconductor Chip)

As illustrated in FIG. 1A, in the second semiconductor chip 200, a second interconnect layer 202 is stacked on a silicon second semiconductor substrate 201 serving as a base, and a second passivation layer 211 is stacked on the second interconnect layer 202 and covers the second interconnect layer 202. A second electrode pad 210 is formed at a predetermined location on the second interconnect layer 202. A second bump 220 is formed on the second electrode pad 210. The second bump 220 is formed at a location at which the second bump 220 is electrically connected to the first bump 120.

The second electrode pad 210 is made of aluminium (Al) with a thickness of 2 μm, for example. Although not shown, a contact layer of, for example, tantalum nitride with a thickness of about 200 nm may be formed at the interface between the second electrode pad 210 and its underlying second interconnect layer 202.

The second bump 220 is formed on the flat second electrode pad 210, and projects from the front surface of the second semiconductor chip 200 in cross section. The second bump 220 has a stacked structure including: a second bump solder layer 220d with a diameter of, for example, 15 μm and a thickness of 3 μm; a second bump barrier metal layer 220c with a thickness of 2 μm; and a second bump height-adjustment metal layer 220b with a thickness of 5 μm. A solder material for the second bump solder layer 220d is, for example, tin (Sn). The second bump barrier metal layer 220c prevents formation of a metal compound between the solder material and its underlying metal, and is made of, for example, nickel (Ni). The second bump height-adjustment metal layer 220b adjusts the height of the bump, and is made of, for example, copper (Cu). To enhance adherence, a second bump contact layer 220a of a material such as titanium (Ti) with a thickness of about 200 nm, for example, may be formed at the interface between the second bump height-adjustment metal layer 220b and its underlying second electrode pad 210.

The thickness (height) of the second bump 220 is not limited to this example, and may be in the range from 2 μm to 50 μm, for example. The diameter of the second bump 220 is not limited to this example, and may be in the range from 2 μm to 25 μm, for example.

The material for the second bump 220 is not limited to this example, and may be a metal containing at least one of copper (Cu), tin (Sn), nickel (Ni), silver (Ag), gold (Au), cobalt (Co), bismuth (B), zinc (Zn), indium (In), germanium (Ge), or tungsten (W), or a conductive metal compound containing at least one of copper (Cu), tin (Sn), nickel (Ni), silver (Ag), gold (Au), cobalt (Co), bismuth (B), zinc (Zn), indium (In), germanium (Ge), or tungsten (W).

Figure 4:
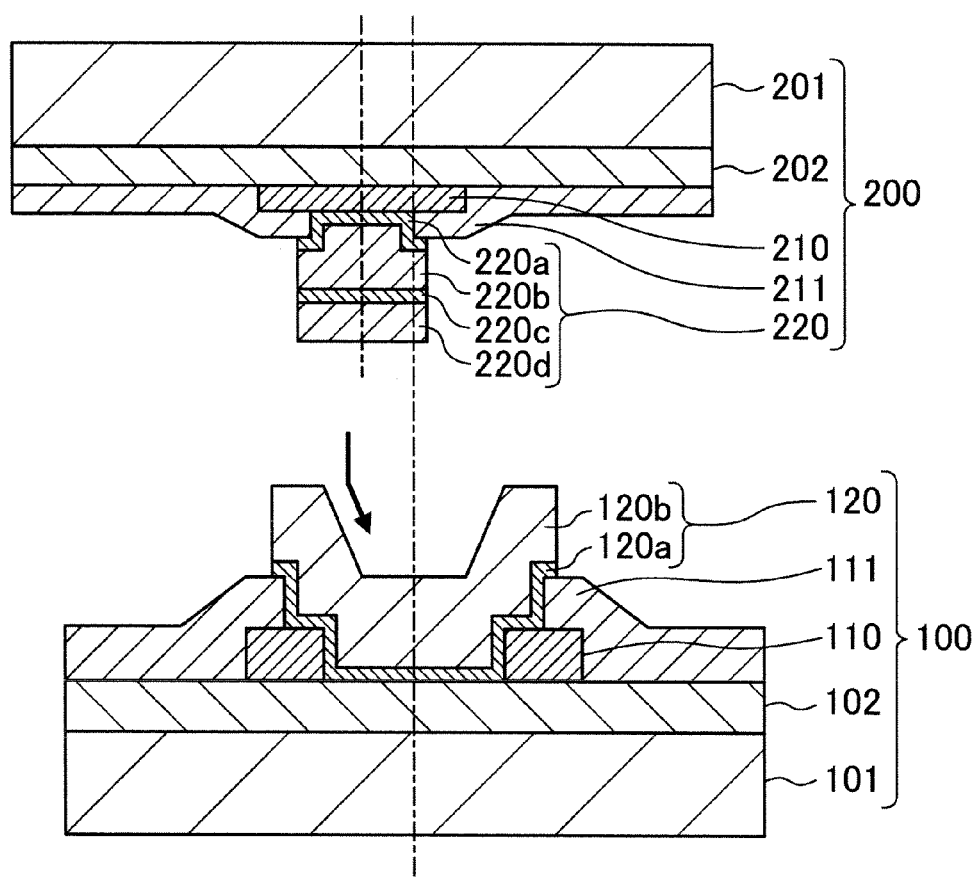
FIG. 4 is a cross-sectional view showing the method for fabricating a semiconductor device of the embodiment and showing that no displacement occurs in bonding of the first semiconductor chip and the second semiconductor chip.
Figure 5:
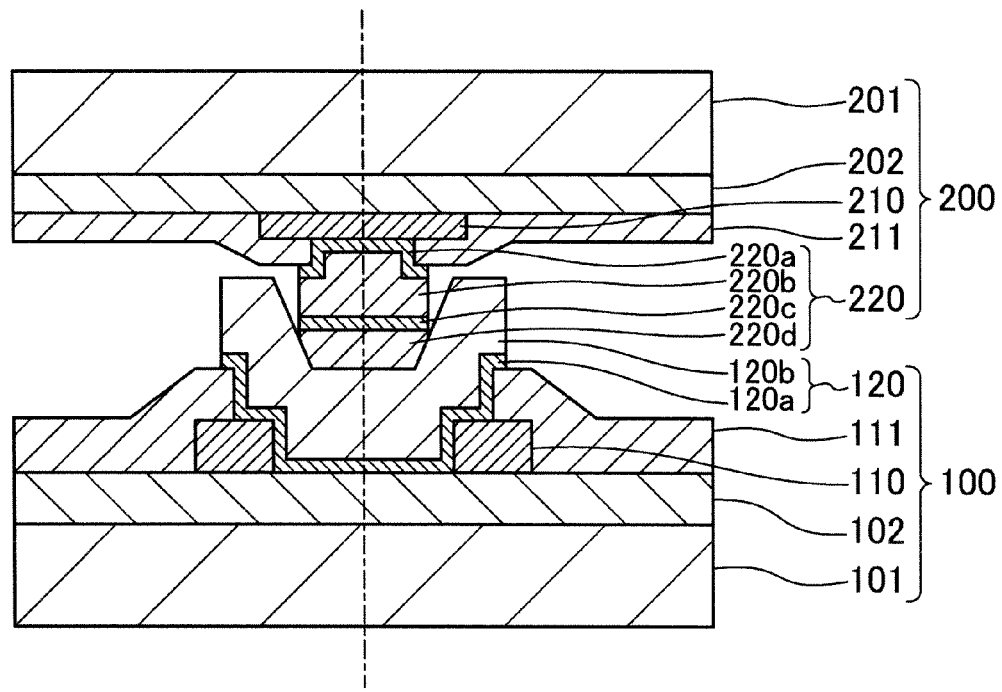
FIG. 5 is a cross-sectional view showing the method for fabricating a semiconductor device of the embodiment with respect to a state after bonding of the first semiconductor chip and the second semiconductor chip.

As illustrated in FIG. 1B, the diameter of the second bump 220 is smaller than the diameter of the inner circle formed by cutting out the first electrode pad 110 so that the second bump is engaged with the inside of the recessed shape of the first bump 120 as illustrated in FIGS. 4 and 5.

(Fabrication Method)

A method for fabricating a semiconductor device according to this embodiment will be described with reference to FIGS. 2A to 2E, FIGS. 3A to 3C, and FIG. 4.

First, a method for producing a first semiconductor chip 100 will be described with reference to FIGS. 2A to 2E.

Figure 2A:
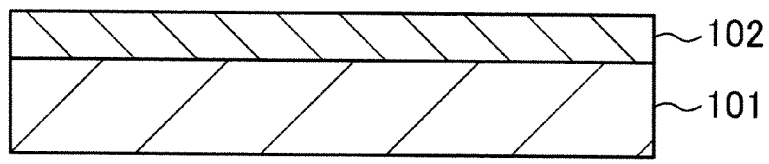
FIGS. 2A to 2E are cross-sectional views showing process steps of fabricating a first semiconductor chip in a method for fabricating a semiconductor device according to an embodiment of the present disclosure.

As illustrated in FIG. 2A, a first interconnect layer 102 is formed on a first semiconductor substrate 101 serving as a base. The first interconnect layer 102 is illustrated as a single layer in FIG. 2A, but may be a multi-level interconnect layer including multiple levels of interconnect layers and insulating layers disposed between the interconnect layers.

Figure 2B:
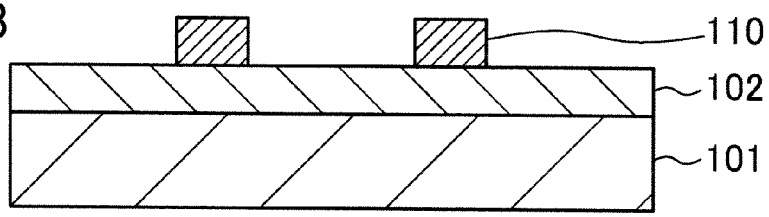

Next, as illustrated in FIG. 2B, tantalum nitride to be a contact layer and aluminium (Al) to be an electrode pad body are deposited in this order by, for example, sputtering over the entire surface of the first interconnect layer 102, and then are patterned by lithography and dry etching, thereby forming a first electrode pad 110. In this process, the first electrode pad 110 is patterned to have a shape whose inner portion is cut out.

Figure 2C:
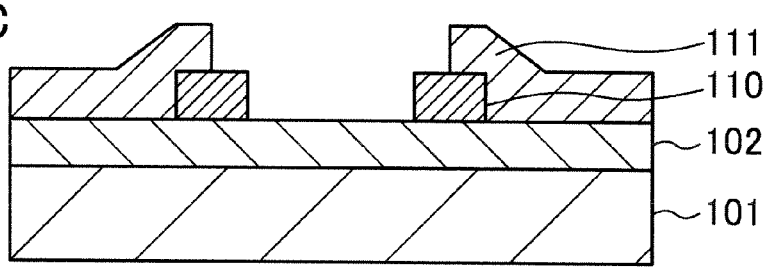

Then, as illustrated in FIG. 2C, silicon nitride (SiN) is deposited by, for example, chemical vapor deposition (CVD) over the entire surface of the first semiconductor substrate 101. Thereafter, a first passivation layer 111 having an opening is formed by lithography and dry etching over the first electrode pad 110 such that an end surface of the opening of the first passivation layer 111 is located on the first electrode pad 110.

Figure 2D:
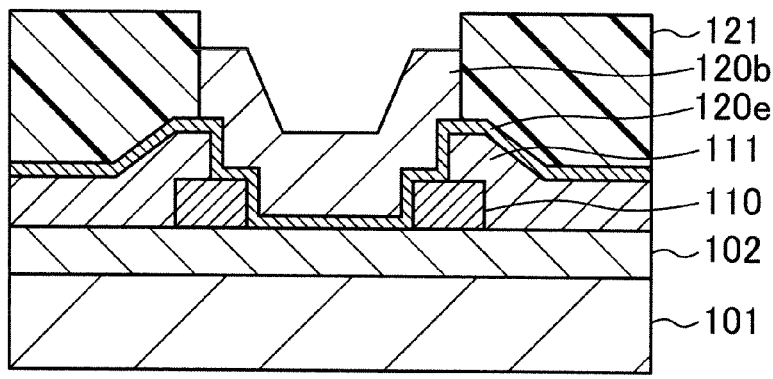

Subsequently, as illustrated in FIG. 2D, a first contact metal layer 120e, which is a laminated film of titanium (Ti) to be a first bump contact layer 120a and copper (Cu) as a seed layer, is deposited by, for example, sputtering over the entire surface of the first semiconductor substrate 101. Then, a first resist layer 121 having an opening is formed by lithography such that an end surface of the opening of the first resist layer 121 is located on the first electrode pad 110. Thereafter, a first bump conductive layer 120b of copper (Cu) is grown by, for example, electroplating only in the opening of the first resist layer 121.

Figure 2E:
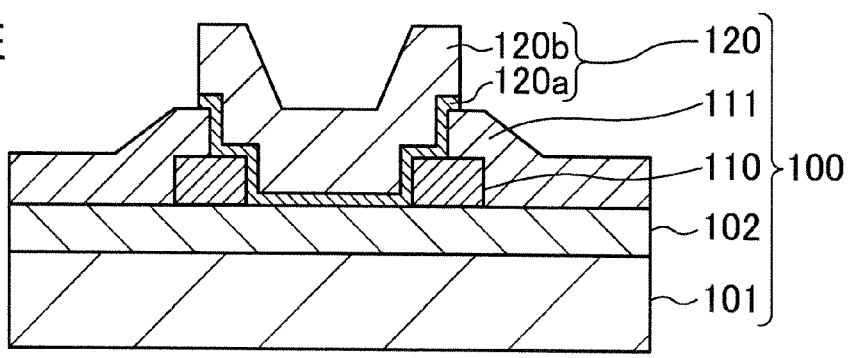

Then, as illustrated in FIG. 2E, the first resist layer 121 is removed, and an exposed unnecessary part of the first contact metal layer 120e as the laminated film of copper (Cu) as the seed layer and titanium (Ti) as the contact layer is removed by, for example, wet etching, thereby forming a first bump 120. In this manner, a first semiconductor chip 100 is obtained.

In the foregoing method, the first bump 120 is formed over the step of the first electrode pad 110, and has a recessed shape whose center is recessed in conformity with the shape of the electrode pad.

A method for producing a second semiconductor chip 200 will be described with reference to FIGS. 3A to 3C.

Figure 3A:
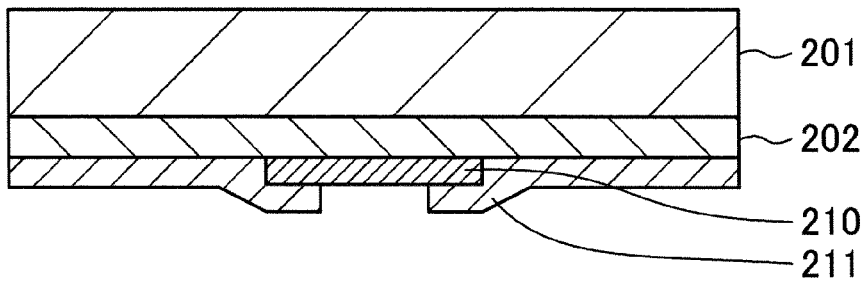
FIGS. 3A to 3C are cross-sectional views showing process steps of fabricating a second semiconductor chip in the method for fabricating a semiconductor device of the embodiment.

First, FIG. 3A, a second interconnect layer 202 is formed on a second semiconductor substrate 201 serving as a base. The first interconnect layer 102 is illustrated as a single layer in FIG. 3A, but may be a multi-level interconnect layer including multiple levels of interconnect layers and insulating layers disposed between the interconnect layers. Next, a second electrode pad 210 of aluminium (Al) is formed on a predetermined region of the second interconnect layer 202. Then, a second passivation layer 211 covering the second interconnect layer 202 and having an opening on the second electrode pad 210 is formed.

Figure 3B:
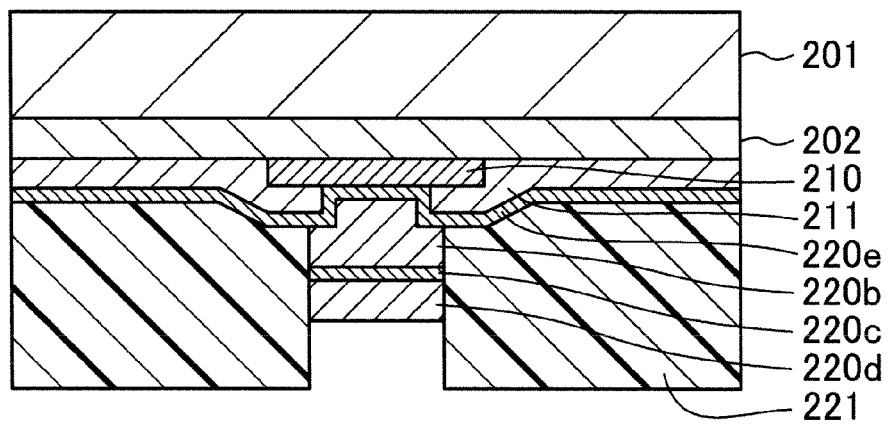

Then, as illustrated in FIG. 3B, a second contact metal layer 220e, which is a laminated film of titanium (Ti) to be a second bump contact layer 220a and copper (Cu) as a seed layer, is deposited by, for example, sputtering over the entire surface of the second semiconductor substrate 201. Thereafter, a second resist layer 221 having an opening is formed by lithography such that an end surface of the opening of the second resist layer 221 is located on the second electrode pad 210. Subsequently, a second bump height-adjustment metal layer 220b of copper (Cu), a second bump barrier metal layer 220c of nickel (Ni), and a second bump solder layer 220d of tin (Sn) are grown by, for example, electroplating only in the opening of the second resist layer 221.

Figure 3C:
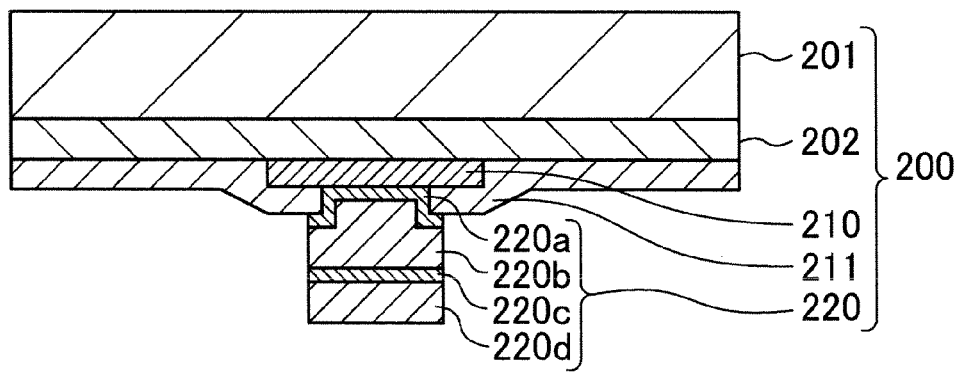

Then, as illustrated in FIG. 3C, the second resist layer 221 is removed, and an exposed part of the second contact metal layer 220e as the laminated film of copper (Cu) as the seed layer and titanium (Ti) as the contact layer is removed by, for example, wet etching, thereby forming a second bump 220. In this manner, a second semiconductor chip 200 is obtained.

The first bump 120 and the second bump 220 have an identical layout in order to establish electrical connection (conduction) therebetween.

A method for bonding the first semiconductor chip 100 and the second semiconductor chip 200 will now be described with reference to FIG. 4.

The second semiconductor chip 200 is flip-chip bonded to the first semiconductor chip 100 with a bonder (not shown). In this bonding, with the bonder, the first semiconductor chip 100 is fixed to the stage, and the second semiconductor chip 200 is held with a chuck.

Then, the first semiconductor chip 100 and the second semiconductor chip 200 are positioned relative to each other with a technique such as image recognition. In this positioning, the first semiconductor chip 100 and the second semiconductor chip 200 are oriented such that the surfaces thereof provided with bumps face each other.

Thereafter, the chuck of the bonder is moved downward so that the second semiconductor chip 200 moves downward to come into contact with the first semiconductor chip 100. In this process, even if an insufficient positioning accuracy with the bonder causes a displacement between the first bump 120 and the second bump 220, for example, the recessed shape of the first bump 120 enables the second bump 220 to come into contact with a recessed inner slope of the first bump 120 and to be subjected to a pressure. Thus, the displacement moves to a direction in which self-alignment is performed. Accordingly, as illustrated in FIG. 5, the first bump 120 and the second bump 220 are connected to each other without fail.

Figure 6:
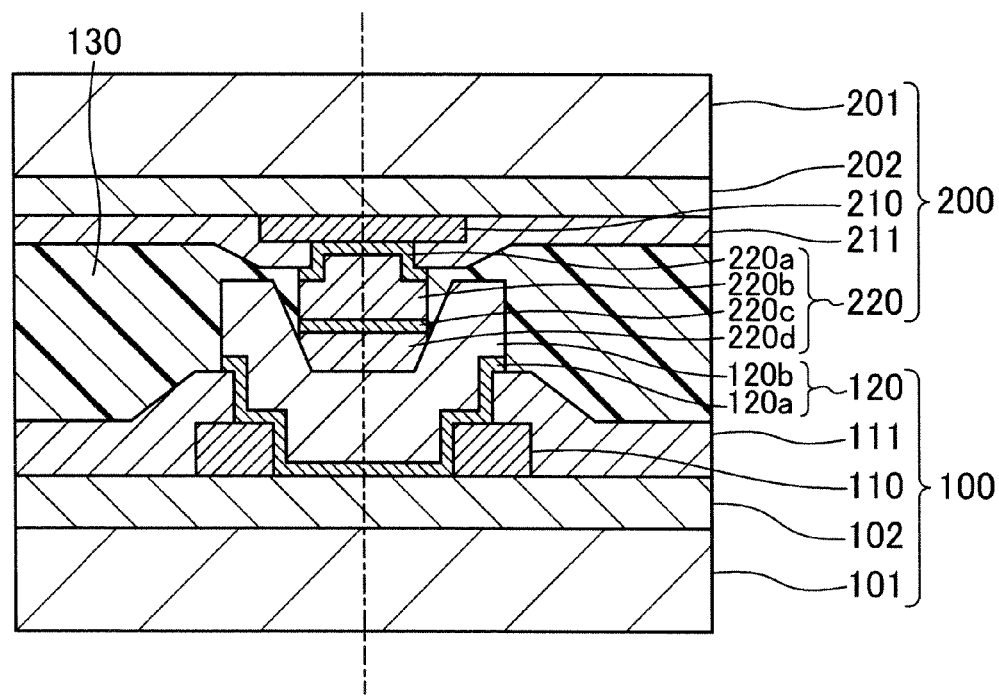
FIG. 6 is a cross-sectional view showing the method for fabricating a semiconductor device of the embodiment with respect to a state after formation of underfill resin in a case where the underfill resin is applied after bonding of the first semiconductor chip and the second semiconductor chip.
Figure 7:
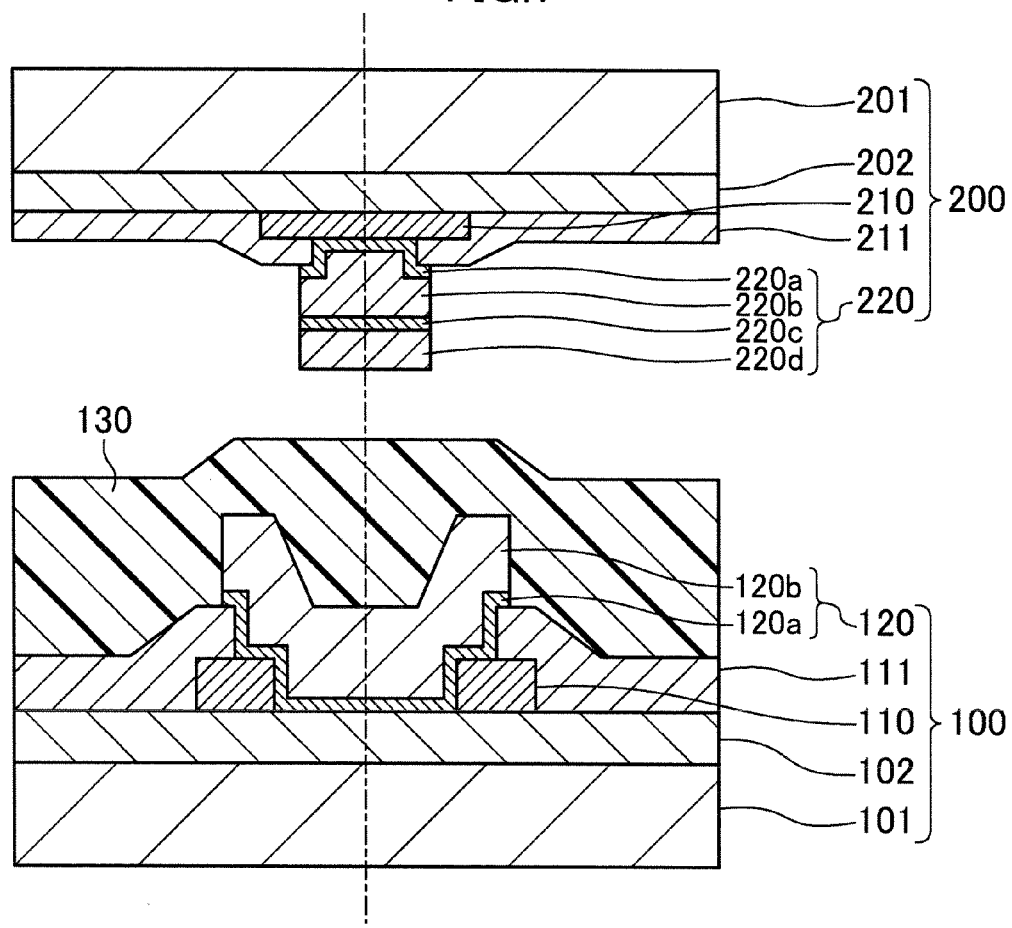
FIG. 7 is a cross-sectional view showing the method for fabricating a semiconductor device of the embodiment with respect to a state after formation of underfill resin in a case where the underfill resin is applied before bonding of the first semiconductor chip and the second semiconductor chip.

Subsequently, a gap between the first bump 120 and the second bump 220 is filled with an underfill material containing, for example, epoxy resin as a main component, and the under fill material is cured. Thus, as illustrated in FIG. 6, an underfill resin 130 is formed (post coating). As illustrated in FIG. 7, the underfill resin 130 may be previously applied onto the first semiconductor chip 100 before the bonding of the first bump 120 and the second bump 220 (precoating). In this case, the resin can be cured by heat treatment performed in bump bonding. In the case of precoating, the underfill resin 130 remaining in the recess of the first bump 120 is pushed out to the peripheral portion by the second bump 220 when the first bump 120 and the second bump 220 are bonded under pressure, thereby bonding the first bump 120 and the second bump 220.

As described above, in this embodiment, since the first bump 120 has the recessed shape whose center is recessed, even when an overlapping displacement occurs between the first semiconductor chip 100 and the second semiconductor chip 200 occurs in a subsequent process of bonding the first semiconductor chip 100 to the second semiconductor chip 200, the second bump can be engaged with the recesses of the first bump 120 in a self-alignment manner in conformity with the shape of the recess during bonding under pressure. Thus, it is possible to reduce sliding between the first bump 120 and the second bump 220, which are to be electrically connected to each other, and lateral displacement of the semiconductor chips caused by the sliding.

The process of patterning the first electrode pad 110 into the hollow cylindrical shape can be shared by a patterning process for forming the first electrode pad 110. Thus, no additional mask formation is needed, and thus, the number of fabrication processes does not increase. As a result, the semiconductor chips can be accurately positioned relative to each other without an increase in the number of fabrication processes.

In this embodiment, flip-chip bonding of bonding two semiconductor chips is employed. However, the present disclosure is not limited to bonding of this type, and is applicable to face-to-back bonding in which at least one of the semiconductor chips has a through-silicon via (TSV).

A configuration in the case where the second semiconductor chip has a TSV will now be described with reference to FIG. 8.

Figure 8:
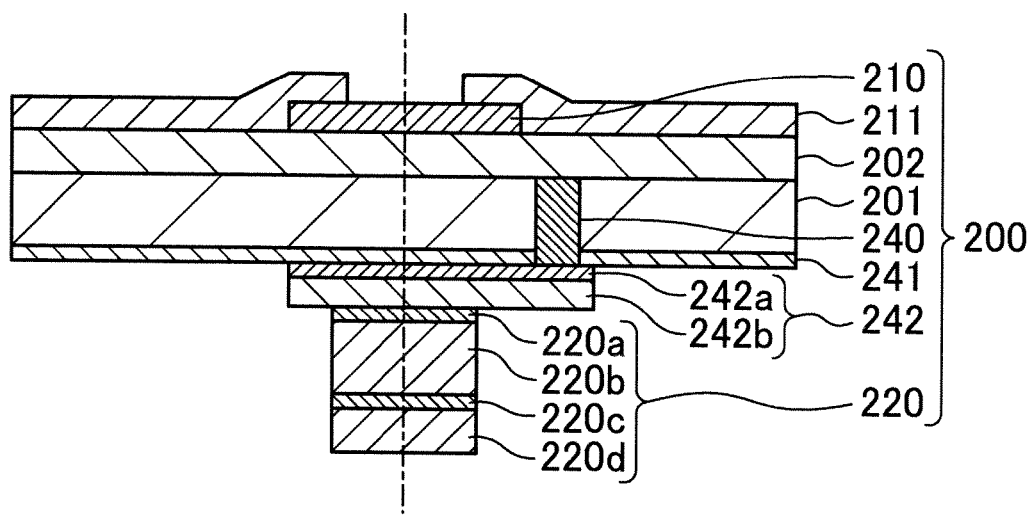
FIG. 8 is a cross-sectional view illustrating a second semiconductor chip of the semiconductor device of the embodiment in the case of providing a TSV in the second semiconductor chip.

As illustrated in FIG. 8, in the second semiconductor chip 200, the second interconnect layer 202 is stacked on the front surface of the second semiconductor substrate 201 serving as a base, and the second passivation layer 211 is stacked on the second interconnect layer 202 and covers the second interconnect layer 202. The back-surface passivation layer 241 is formed over the back surface of the second semiconductor substrate 201. A TSV 240 is formed in the second semiconductor substrate 201 extending from the front surface to the back surface of the second semiconductor substrate 201. A back-surface interconnect 242 is formed at a predetermined location on the back surface of the second semiconductor substrate 201. A second bump 220 is formed on the back-surface interconnect 242. The second bump 220 is positioned such that the second bump 220 is electrically connected to the first bump 120.

The TSV 240, the back-surface passivation layer 241, and the back-surface interconnect 242, which are features of this example different from those illustrated in FIG. 1A, will now be described in detail. The other part of the configuration may be similar to that described with reference to FIG. 1A.

The TSV 240 has a cylindrical columnar shape with a diameter of 5 μm and a depth of 50 μm. A cylindrical space in the insulating film of silicon oxide with a thickness of 200 nm is filled with copper (Cu). Although not shown, a barrier metal layer of tantalum (Ta) with a thickness of about 150 nm may be formed at the interface between the insulating film and copper.

The back-surface passivation layer 241 is, for example, a silicon nitride film with a thickness of 1 μm.

The back-surface interconnect 242 is used for connecting the TSV 240 to the second bump 220. The back-surface interconnect 242 has a line width of about 10 μm, for example, and has a stacked structure including a contact layer 242a of titanium (Ti) with a thickness of about 50 nm and a conductive layer 242b of copper (Cu) with a thickness of about 5 μm.

The diameter of TSV 240 is not limited to 5 μm, and may be in the range from 3 μm to 20 μm, for example. The depth of the TSV 240 is in such a range that the aspect ratio (obtained by dividing the depth by the diameter) to the diameter is in the range from 5 to 20.

The thickness of the back-surface passivation layer 241 is not limited to 1 μm, and is in the range from 200 nm to 5 μm. The material for the back-surface passivation layer 241 is not limited to a silicon nitride film, and may be a silicon dioxide film ($SiO_2$) or a resin material containing epoxy resin.

The thickness of the back-surface interconnect 242 is not limited to 5 μm, and is in the range from 500 nm to 10 μm.

The TSV 240 and the second bump 220 may be directly connected to each other without the back-surface interconnect 242.

The number of semiconductor chips to be stacked is not limited to two. The bump pitch is not limited to 40 μm, and is effective in the range from 10 μm to 150 μm.

The semiconductor chips 100 and 200 are LSI chips in this embodiment, but one of these chips may be an interposer.

The cut-out shape of the inner circle of the first electrode pad 110 is circular in this embodiment, but may be polygonal. In such a case, the diameter of the circle inscribed in the polygon needs to be smaller than the diameter of the first bump 120.

Figure 9:
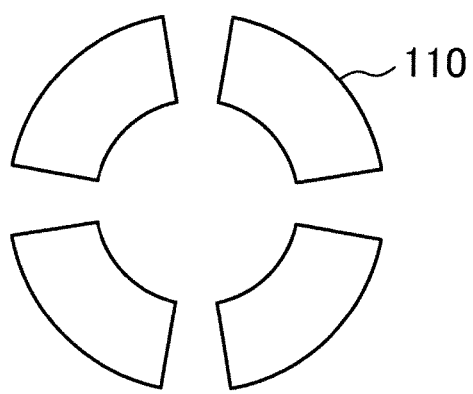
FIG. 9 is a plan view illustrating a pad of the semiconductor device of the embodiment in a case where a first pad has slits.

In this embodiment, the cut-out shape of the inner circle of the first electrode pad 110 is circular, but as illustrated in FIG. 9, may be a shape having slits formed from the cut-out side of the inner circle in the pad toward the outer circle. The presence of the slits allows recessed shapes to be formed toward the outer periphery of the first bump 120 so that the contact area between the second bump solder layer 220d of the second bump 220 and the first bump 120 increases, thereby enhancing adherence between the first bumps.

In the case of precoating in which the underfill material is applied before bonding, the underfill material remaining in the recess is released along a groove to the outside of the recess of the bump, and thereby, entering of the underfill material between the bumps can be reduced advantageously.

The dimensions of the passivation layer, the bumps, and the pad shapes may be variously changed within the scope of the disclosure.

A semiconductor device according to the present disclosure is useful as a semiconductor device in which semiconductor chips are accurately positioned relative to each other, particularly a semiconductor device having a structure in which a plurality of semiconductor chips are directly bonded to each other with bumps.

What is claimed is:

1. A semiconductor device comprising:
   a multilayer chip including a first semiconductor chip and a second semiconductor chip that are bonded together, wherein
   a first electrode pad is provided on a principal surface of the first semiconductor chip,
   a first bump is provided on the first electrode pad,
   a second bump is provided on a principal surface of the second semiconductor chip and is bonded to the first bump,
   the first electrode pad has an opening extending through the first electrode pad, the opening formed by removing a center portion of the first electrode pad,
   the opening and an entire peripheral portion of the opening form a stepped shape, and
   the first bump having a recessed portion that is recessed at a center thereof, in plan view immediately above the opening of the first electrode pad, the recessed portion covers the stepped shape, and the recessed portion conforms to a flat portion of the first electrode pad.

2. The semiconductor device of claim 1, wherein the first electrode pad has a hollow cylindrical shape in plan view.

3. The semiconductor device of claim 1, wherein the first electrode pad has a slit in the peripheral portion.

4. The semiconductor device of claim 1, wherein
   a through-hole electrode penetrates at least one of the first semiconductor chip or the second semiconductor chip from a front surface to a back surface thereof, and
   the through-hole electrode is electrically connected to the first bump and the second bump.

5. The semiconductor device of claim 1, wherein the first bump is made of either a metal selected from the group consisting of copper, tin, nickel, silver, gold, cobalt, bismuth, zinc, indium, germanium, and tungsten, or a conductive metal compound containing a metal selected from the group consisting of copper, tin, nickel, silver, gold, cobalt, bismuth, zinc, indium, germanium, and tungsten.

6. The semiconductor device of claim 1, wherein the second bump is made of either a metal selected from the group consisting of copper, tin, nickel, silver, gold, cobalt, bismuth, zinc, indium, germanium, and tungsten, or a conductive metal compound containing a metal selected from the group consisting of copper, tin, nickel, silver, gold, cobalt, bismuth, zinc, indium, germanium, and tungsten.

7. The semiconductor device of claim 1, wherein the first electrode pad has a thickness of 0.3 μm to 5 μm.

8. The semiconductor device of claim 1, wherein the first bump has a height of 4 μm to 60 μm.

9. The semiconductor device of claim 1, wherein the second bump has a height of 2 μm to 50 μm.

10. The semiconductor device of claim 1, wherein the recessed portion of the first bump has an upper surface which directly contacts the second bump.

11. The semiconductor device of claim 1, wherein the recessed portion of the upper surface of the first bump is formed prior to contacting the second bump.

12. The semiconductor device of claim 2, wherein the second bump has a diameter equal to or smaller than an inner diameter of the hollow cylindrical shape of the first electrode pad.

13. The semiconductor device of claim 2, further comprising:
- a first passivation layer that covers the first semiconductor chip, is sandwiched between the first bump and the first electrode pad, and has an opening in which the first electrode pad is exposed such that an end of the opening is located on the first electrode pad, wherein
- the opening of the first passivation layer has a diameter smaller than a diameter of the first bump and larger than an inner diameter of the hollow cylindrical shape of the first electrode pad.

14. The semiconductor device of claim 2, wherein the first bump has a diameter of 4 μm to 30 μm.

15. The semiconductor device of claim 2, wherein the second bump has a diameter of 2 μm to 25 μm.

16. The semiconductor device of claim 2, wherein the first electrode pad has an inner diameter of 2 μm to 25 μm.

* * * * *